United States Patent
Lambert et al.

(10) Patent No.: US 7,555,582 B2
(45) Date of Patent: Jun. 30, 2009

(54) PORTABLE UNIVERSAL SERIAL BUS MEMORY DEVICES AND METHODS FOR USING SUCH DEVICES

(76) Inventors: Grady David Lambert, 26 New Pond Rd., Groton, MA (US) 01450; Joydeep Chowdhury, 10808 Ashland Mill Ct., Raleigh, NC (US) 27617; Carson Stuart, 903 Emory Dr., Chapel Hill, NC (US) 27517; Ryan McDaniel, 1 Cayuga Dr., Hudson, MA (US) 01749

( * ) Notice: Subject to any disclaimer, the term of this patent is extended or adjusted under 35 U.S.C. 154(b) by 85 days.

(21) Appl. No.: 11/640,527

(22) Filed: Dec. 15, 2006

(65) Prior Publication Data

US 2008/0147899 A1 Jun. 19, 2008

(51) Int. Cl.
*G06F 13/12* (2006.01)
*G06F 13/38* (2006.01)

(52) U.S. Cl. .............................. 710/74; 710/62; 710/72

(58) Field of Classification Search .................. 710/62, 710/72, 74
See application file for complete search history.

(56) References Cited

U.S. PATENT DOCUMENTS

| | | | | |
|---|---|---|---|---|
| 6,438,638 | B1* | 8/2002 | Jones et al. ................. | 710/301 |
| 6,567,273 | B1* | 5/2003 | Liu et al. .................... | 361/737 |
| 6,993,618 | B2* | 1/2006 | Chen et al. .................. | 710/305 |
| 7,151,673 | B2* | 12/2006 | Le et al. ..................... | 361/737 |
| 7,162,549 | B2* | 1/2007 | Mambakkam et al. ........ | 710/16 |
| 7,222,205 | B2* | 5/2007 | Jones et al. ................. | 710/301 |
| 2001/0025882 | A1* | 10/2001 | Coulier ....................... | 235/380 |
| 2003/0093606 | A1* | 5/2003 | Mambakkam et al. ....... | 710/305 |
| 2003/0212848 | A1* | 11/2003 | Liu et al. .................... | 710/305 |
| 2004/0059860 | A1* | 3/2004 | Liu et al. .................... | 710/313 |
| 2005/0160223 | A1* | 7/2005 | Chen et al. .................. | 711/115 |
| 2005/0204086 | A1* | 9/2005 | Le et al. ..................... | 710/301 |
| 2007/0180177 | A1* | 8/2007 | Jones et al. ................. | 710/301 |
| 2007/0283069 | A1* | 12/2007 | Jones et al. ................. | 710/301 |

* cited by examiner

*Primary Examiner*—Niketa I Patel
*Assistant Examiner*—David E Martinez
(74) *Attorney, Agent, or Firm*—Perkins Coie LLP

(57) ABSTRACT

Portable USB memory modules or devices and methods for using such devices are disclosed herein. In one embodiment, a portable memory module can include a housing having a CompactFlash card form factor and one or more flash memory devices carried by the housing. The portable memory module can also include a USB controller carried by the housing and coupled to the one or more flash memory devices. The portable memory module can further include a connector including a first portion coupled to the controller and a second portion configured to mate with a host device. In several embodiments, the connector includes a plurality of pins to transfer signals to and from the memory module. The pins are configured to mate with a fifty pin socket on the host device.

6 Claims, 6 Drawing Sheets

USB Connector Pin-Out Configuration

| 26 | 27 | 28 | 29 | 30 | 31 | 32 | 33 | 34 | 35 | 36 | 37 | 38 | 39 | 40 | 41 | 42 | 43 | 44 | 45 | 46 | 47 | 48 | 49 | 50 |
|---|---|---|---|---|---|---|---|---|---|---|---|---|---|---|---|---|---|---|---|---|---|---|---|---|
| N | N | N | N | N | N | N | RST# G | N | WP# G | N | N | P | N | | D- B | N | N | N | STS O | | N | N | N | G |
| 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 |
| I | N | N | N | N | N | N | | N | | N | N | P | D+ B | | D+ B | | N | N | N | N | N | N | CD# G | N |

Standard CompactFlash Pin-Out Configuration

| 26 | 27 | 28 | 29 | 30 | 31 | 32 | 33 | 34 | 35 | 36 | 37 | 38 | 39 | 40 | 41 | 42 | 43 | 44 | 45 | 46 | 47 | 48 | 49 | 50 |
|---|---|---|---|---|---|---|---|---|---|---|---|---|---|---|---|---|---|---|---|---|---|---|---|---|
| G | B | B | B | B | B | I | G | G | G | G | P | P | G | N | G | P | P | I | B | B | B | B | B | G |
| 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 |
| G | B | B | B | B | B | I | I | G | G | G | P | P | G | G | G | G | G | I | I | B | B | B | P | G |

| G | Ground |
|---|---|
| P | Power |
| B | Bi-directional |
| I | Input |
| O | Output |
| N | Open |

| Pin Num | PC Card Memory Mode | | | Pin Num | True IDE Mode | | | Pin Num | USB Mode | | |
|---|---|---|---|---|---|---|---|---|---|---|---|
| | Signal Name | Pin Type | I/O Type | | Signal Name | Pin Type | I/O Type | | Signal Name | Pin Type | I/O Type |
| 1 | GND | | Ground | 1 | GND | | Ground | 1 | GND | | Ground |
| 2 | D3 | I/O | I1Z, OZ3 | 2 | D3 | I/O | I1Z, OZ3 | 2 | NC | | Open |
| 3 | D4 | I/O | I1Z, OZ3 | 3 | D4 | I/O | I1Z, OZ3 | 3 | NC | | Open |
| 4 | D5 | I/O | I1Z, OZ3 | 4 | D5 | I/O | I1Z, OZ3 | 4 | NC | | Open |
| 5 | D6 | I/O | I1Z, OZ3 | 5 | D6 | I/O | I1Z, OZ3 | 5 | NC | | Open |
| 6 | D7 | I/O | I1Z, OZ3 | 6 | D7 | I/O | I1Z, OZ3 | 6 | NC | | Open |
| 7 | CE1# | I | I3U | 7 | CS0# | I | I3U | 7 | NC | | Open |
| 8 | A10 | I | I1Z | 8 | A10 | I | I1Z | 8 | RST# | I | |
| 9 | OE# | I | I3U | 9 | ATASEL# | I | I3U | 9 | NC | | Open |
| 10 | A9 | I | I1Z | 10 | A9 | I | I1Z | 10 | WP# | I | |
| 11 | A8 | I | I1Z | 11 | A8 | I | I1Z | 11 | NC | | Open |
| 12 | A7 | I | I1Z | 12 | A7 | I | I1Z | 12 | NC | | Open |
| 13 | Vcc | I | Power | 13 | Vcc | I | Power | 13 | Vcc | I | Power |
| 14 | A6 | I | I1Z | 14 | A6 | I | I1Z | 14 | GND | | Ground |
| 15 | A5 | I | I1Z | 15 | A5 | I | I1Z | 15 | D+ | I/O | |
| 16 | A4 | I | I1Z | 16 | A4 | I | I1Z | 16 | GND | | Ground |
| 17 | A3 | I | I1Z | 17 | A3 | I | I1Z | 17 | NC | | Open |
| 18 | A2 | I | I1Z | 18 | A2 | I | I1Z | 18 | NC | | Open |
| 19 | A1 | I | I1Z | 19 | A1 | I | I1Z | 19 | NC | | Open |
| 20 | A0 | I | I1Z | 20 | A0 | I | I1Z | 20 | NC | | Open |
| 21 | D0 | I/O | I1Z, OZ3 | 21 | D0 | I/O | I1Z, OZ3 | 21 | NC | | Open |
| 22 | D1 | I/O | I1Z, OZ3 | 22 | D1 | I/O | I1Z, OZ3 | 22 | NC | | Open |
| 23 | D2 | I/O | I1Z, OZ3 | 23 | D2 | I/O | I1Z, OZ3 | 23 | NC | | Open |
| 24 | WP | O | OT3 | 24 | IOCS16# | O | OT3 | 24 | CD# | O | Ground |
| 25 | CD2# | O | Ground | 25 | CD2# | O | Ground | 25 | NC | | Open |
| 26 | CD1# | O | Ground | 26 | CD1# | O | Ground | 26 | NC | | Open |
| 27 | D11 | I/O | I1Z, OZ3 | 27 | D11 | I/O | I1Z, OZ3 | 27 | NC | | Open |
| 28 | D12 | I/O | I1Z, OZ3 | 28 | D12 | I/O | I1Z, OZ3 | 28 | NC | | Open |
| 29 | D13 | I/O | I1Z, OZ3 | 29 | D13 | I/O | I1Z, OZ3 | 29 | NC | | Open |
| 30 | D14 | I/O | I1Z, OZ3 | 30 | D14 | I/O | I1Z, OZ3 | 30 | NC | | Open |
| 31 | D15 | I/O | I1Z, OZ3 | 31 | D15 | I/O | I1Z, OZ3 | 31 | NC | | Open |
| 32 | CE2# | I | I3U | 32 | CS1# | I | I3U | 32 | NC | | Open |
| 33 | VS1# | O | Ground | 33 | VS1# | O | Ground | 33 | GND | | Ground |
| 34 | IORD# | I | I3U | 34 | IORD# | I | I3U | 34 | NC | | Open |
| 35 | IOWR# | I | I3U | 35 | IOWR# | I | I3U | 35 | NC | | Open |
| 36 | WE# | I | I3U | 36 | WE# | I | I3U | 36 | NC | | Open |
| 37 | RDY | O | OT1 | 37 | INTRQ | O | OT1 | 37 | NC | | Open |
| 38 | Vcc | I | Power | 38 | Vcc | I | Power | 38 | Vcc | I | Power |
| 39 | CSEL# | I | I2Z | 39 | CSEL# | I | I2Z | 39 | GND | | Ground |
| 40 | VS2# | O | OPEN | 40 | VS2# | O | OPEN | 40 | D- | I/O | |
| 41 | RST | I | I2Z | 41 | RST | I | I2Z | 41 | GND | | Ground |
| 42 | WAIT# | O | OT1 | 42 | IORDY | O | OT1 | 42 | NC | | Open |
| 43 | INPACK# | O | OT1 | 43 | DMARQ | O | OT1 | 43 | NC | | Open |
| 44 | REG# | I | I3U | 44 | DMACK# | I | I3U | 44 | NC | | Open |
| 45 | BVD2 | O | OT1 | 45 | DASP# | I/O | I1Z, OZ3 | 45 | STS | O | |
| 46 | BVD1 | O | OT1 | 46 | PDIAG# | I/O | I1Z, OZ3 | 46 | NC | | Open |
| 47 | D8 | I/O | I1Z, OZ3 | 47 | D8 | I/O | I1Z, OZ3 | 47 | NC | | Open |
| 48 | D9 | I/O | I1Z, OZ3 | 48 | D9 | I/O | I1Z, OZ3 | 48 | NC | | Open |
| 49 | D10 | I/O | I1Z, OZ3 | 49 | D10 | I/O | I1Z, OZ3 | 49 | NC | | Open |
| 50 | GND | | Ground | 50 | GND | | Ground | 50 | GND | | Ground |

PORTABLE UNIVERSAL SERIAL BUS MEMORY DEVICES AND METHODS FOR USING SUCH DEVICES

TECHNICAL FIELD

The present disclosure is generally directed toward portable universal serial bus memory devices and methods for using such devices.

BACKGROUND

Universal serial bus (USB) memory cards or drives have become very popular and are well on their way to replacing floppy disk drives as the preferred storage devices for file transfers between personal computers. The USB architecture provides a fast bi-directional isochronous transfer of data between the external drive and the corresponding computer or host device. Moreover, USB flash drives provide greater read/write performance, significantly higher density data storage, and improved reliability as compared with conventional floppy drives.

One concern with the USB architecture, however, is how to leverage this technology in OEM telecommunications/data applications that require a greater degree of reliability with respect to mechanical, electrical, and environmental shock. For example, most commercially-available USB flash drives and their associated connector sets do not meet the requirements for such OEM applications. More specifically, the retention and lifecycle of standard USB connector sets are generally not acceptable for mission critical applications. OEM/ODM designers and manufacturers generally prefer memory devices having more mechanically robust form-factors (e.g., PC Card, Express Card, CompactFlash®, etc.). These devices use pin- and socket-type connector sets configured to ensure good module retention and longer insertion/removal cycle rates.

CompactFlash memory cards, for example, provide high-density storage, portability, low power consumption, and "plug and play" capability. CompactFlash cards, however, include a fifty pin connection and are only configured to fit within either a fifty pin CompactFlash socket or a sixty-eight pin PCMCIA socket. Furthermore, conventional CompactFlash cards that are fully compliant with the industry specifications do not have provisions for a serial bus interface. Express Cards are generally robust devices and include a metal housing and a standard serial communication protocol. Express Cards, however, are significantly larger than CompactFlash memory cards and are not considered an industry standard.

BRIEF DESCRIPTION OF THE DRAWINGS

FIG. 3A is a diagram of a pin-out configuration for a fifty pin connector in accordance with one embodiment of the invention.

FIG. 3B is a chart illustrating the pin assignments and pin types for the connector of FIG. 3A when operating in different protocols.

DETAILED DESCRIPTION

A. Overview/Summary

Figure 1:
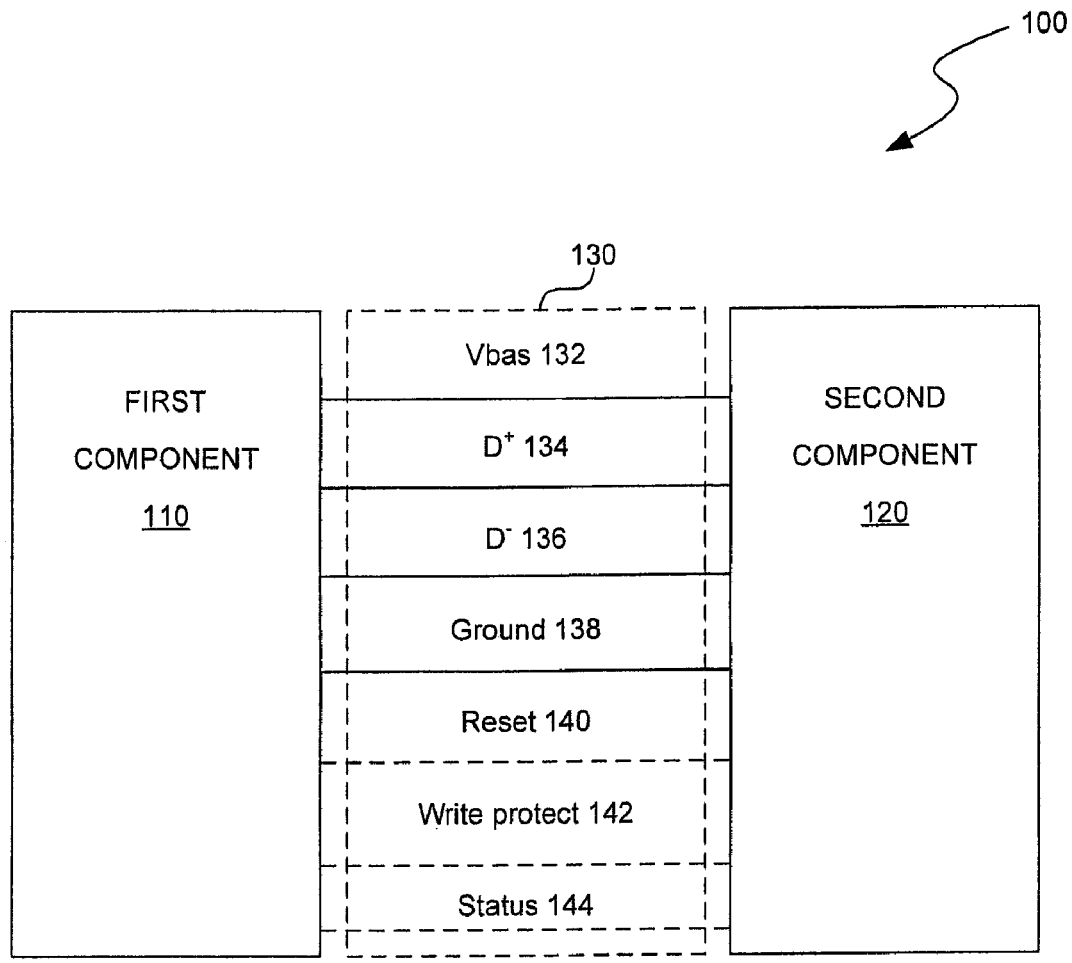
FIG. 1 is a schematic block diagram of a system including a universal serial bus.

The present disclosure is generally directed to portable USB memory modules or devices and methods for using such devices. A portable memory module in accordance with one embodiment of the invention can include a housing having an industry standard memory module form factor (e.g., a CompactFlash card) and one or more flash memory devices carried by the housing. The portable memory module can also include a USB controller carried by the housing and coupled to the one or more flash memory devices. The portable memory module can further include a connector having a first portion coupled to the controller and a second portion configured to mate with a host device. In several embodiments, the connector includes a plurality of pins configured to mate with a fifty pin socket on the host device.

In one particular embodiment, for example, a portable USB memory module can include a casing having an industry standard form factor (e.g., CompactFlash), a flash-based hard drive designed for use as a file storage and transfer device for OEM systems, and a two-wire serial data bus. The serial data bus can include, for example, a USB 2.0 high-speed serial link configured in accordance with the USB 2.0 specification. The memory module can further include a connector or interface having a pin selection designed to support both the USB serial interface and the CompactFlash standard interface (e.g., a fifty pin CompactFlash socket). From a physical standpoint, the memory module includes a mechanically robust and widely accepted form factor (e.g., CompactFlash) and a pin-out configuration having insertion/removal cycle rates suitable for most mission critical applications. Moreover, from an electrical and functional standpoint, the memory module includes the ubiquitous USB architecture, including a high speed serial data bus and the USB-IF communication protocol.

Another aspect of the invention is directed toward a method for manufacturing a portable memory module. The method can include providing a housing having a CompactFlash form factor and an external connector including a plurality of pins configured to transfer signals to and from the memory module. The method can also include installing one or more flash memory devices in the housing and installing a USB 2.0 compliant serial data bus in the housing. The serial data bus is coupled to the one or more flash memory devices and the connector.

Many specific details of certain embodiments of the invention are set forth in the following description and in FIGS. 1-4 to provide a thorough understanding of these embodiments. A person skilled in the art, however, will understand that the invention may be practiced without several of these details or additional details can be added to the invention. Well-known structures and functions have not been shown or described in detail to avoid unnecessarily obscuring the description of the embodiments of the invention. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of features are not precluded.

A. Embodiments of Portable USB Memory Modules or Devices and Methods for Using Such Devices FIG. 1 is a schematic block diagram of a system 100 including a conventional USB bus 130. Embodiments of portable USB memory modules disclosed herein can include serial interfaces similar to the USB bus 130 illustrated in FIG. 1. Accordingly, FIG. 1 and the following description of the system 100 are intended to provide an overview of a standard USB interface and various features of the USB architecture.

The system 100 includes a first component 110, a second component 120, and the USB bus 130. The first and second components 110 and 120 are transceiver components (e.g., sender and receiver components) that can each send and/or receive information (although not necessary simultaneously) via the bus 130. Furthermore, because the USB specification allows for multiple devices on a bus, the bus 130 may be routed to other components (not shown) of the system 100.

The bus 130 links the first component 110 to the second component 120 and allows for serial communication between the two components. The bus 130 can a number of signal lines including, for example, a Vbus line 132, a D+ line 134, a D− line 136, and a ground line 138. The signal lines of the bus 130 each have a particular role. In one embodiment, for example, the Vbus line 132 provides the voltage of the bus 130 and effectively powers the bus 130. The Vbus line 132 may also power one or more components on the bus 130 (typically drawing power from another component on the bus 130). The ground line 138 is typically a common or ground line electrically providing a reference potential for signals on the bus 130 and for components connected to or coupled to the bus 130. The D+ and D− lines 134 and 136 may be implemented as a differential pair of data lines to provide signal integrity. In other embodiments, however, the D+ and D− lines 134 and 136 may be implemented as two separate and independent data lines.

In addition to the typical USB lines described above (e.g., the Vbus, ground, and two data lines), the bus 130 can optionally include one or more supplementary control signal lines. These additional line(s) provide the added control features of wider buses, while maintaining the simplicity of routing and design of the USB architecture. In the embodiment illustrated in FIG. 1, for example, the bus 130 further includes a reset line 140, a write protect line 142, and a status line 144. In other embodiments, however, the bus 130 can include other dedicated control lines, or the bus 130 can have a different combination of lines than those shown in FIG. 1.

Figure 2A:
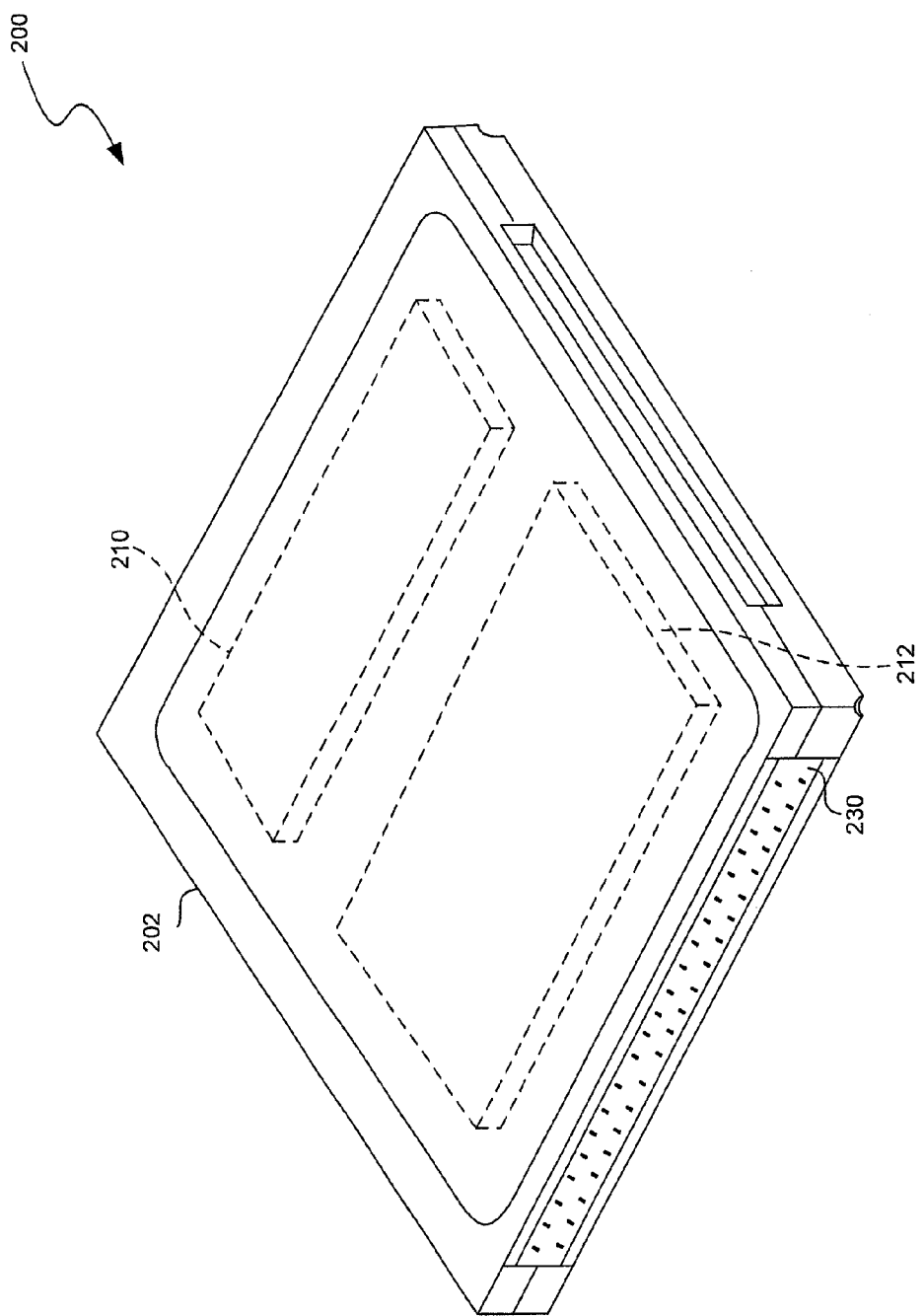
FIG. 2A is a partially schematic, isometric view of a portable USB memory module configured in accordance with an embodiment of the invention.

FIG. 2A is a partially schematic, isometric view of a portable memory module or device 200 configured in accordance with an embodiment of the invention. The memory module 200 includes a housing 202, flash memory 210 (shown schematically in broken lines), a USB controller 212 (shown schematically in broken lines), and an interface or connector 230. The housing 202 is a robust mechanical housing or enclosure that provides physical and environmental protection for the internal components and circuitry of the memory module 200. In the embodiment illustrated in FIG. 2A, the housing 202 has a form factor corresponding to the industry standard CompactFlash form factor, with a length of approximately 36 mm, a width of approximately 43 mm, and a thickness of about 3.3 mm (for CF I) or about 5 mm (for CF II). Accordingly, because the dimensions of the housing 202 correspond to the standardized dimensions for CompactFlash cards, the memory module 200 is configured to fit within any receptacle or socket designed for CompactFlash cards. In other embodiments, however, the housing 202 can have a different form factor and/or different dimensions.

The USB controller 212 is configured to interface with a host system (not shown) to allow data to be written to and/or read from the flash memory 210. As described in greater detail below with reference to FIG. 2B, the controller 212 utilizes a two-wire serial data bus and the USB-IF communication protocol. One advantage of this feature is that the USB protocol provides improved integration, signal integrity, and data reliability as compared with conventional mass storage devices (e.g., IDE, PC Card, CompactFlash, etc.)

The connector 230 is configured to support both the USB serial interface and the CompactFlash interface. As shown in FIG. 2A, for example, the connector 230 includes a fifty pin connection configured to interface with a standard fifty pin CompactFlash socket or a standard sixty-eight pin PCMCIA socket. As discussed in greater detail below, however, the pin selection and pin assignment for the connector 230 can be modified such that the connector 230 also functions as a standard USB connector set when plugged into an appropriate socket. One advantage of this feature is that the memory module 200 can utilize the USB interface when plugged into a host device having the appropriate socket, while also being backward compatible with most conventional CompactFlash sockets.

Figure 2B:
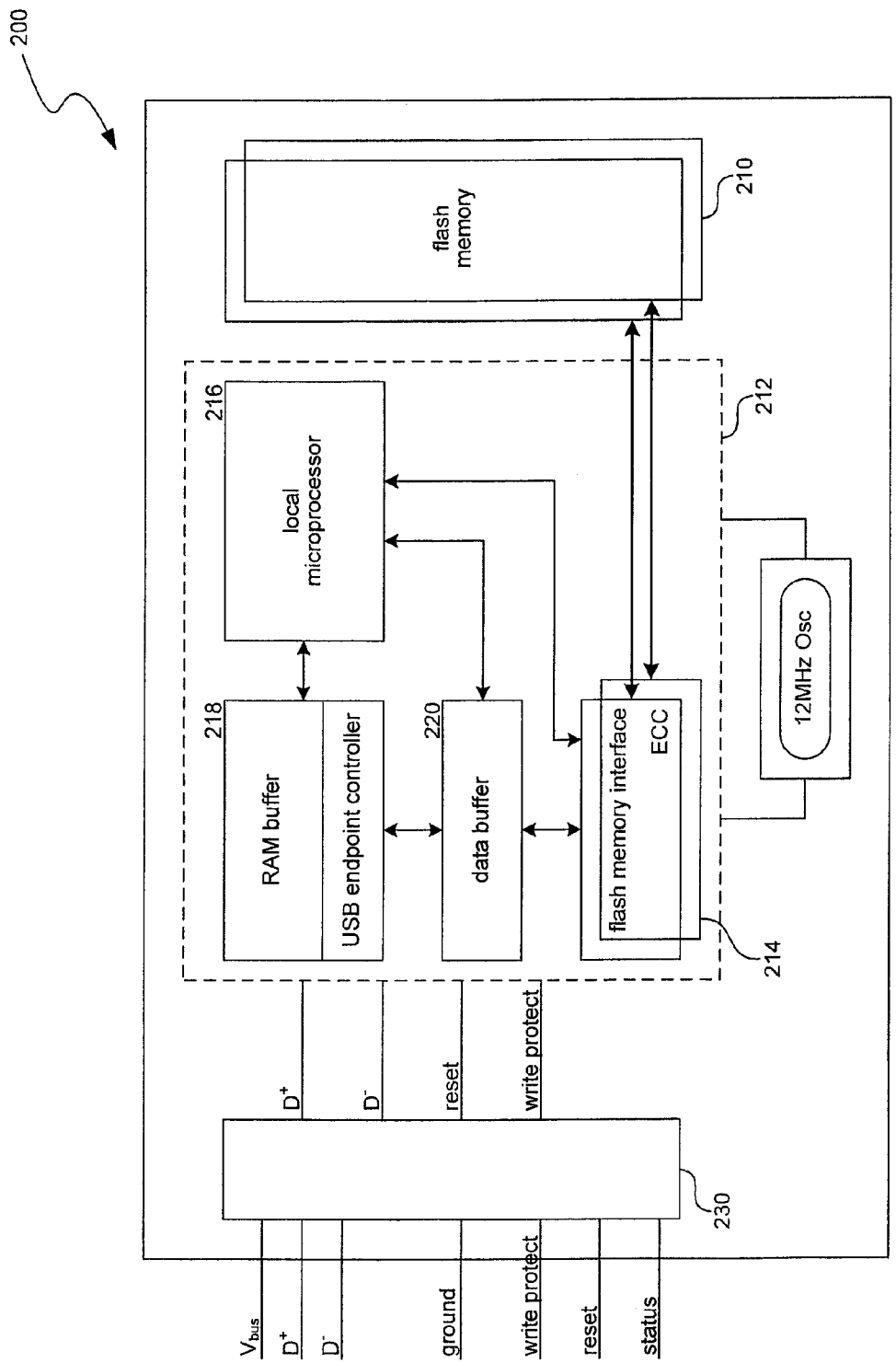
FIG. 2B is a schematic block diagram of the portable USB memory module of FIG. 2A.

FIG. 2B is a schematic block diagram of the memory module 200 of FIG. 2A. Referring to FIGS. 2A and 2B together, the flash memory 210 can include from one to four flash chips (two are shown in the embodiment illustrated in FIG. 2B) or other suitable memory chips. In one embodiment, the memory module 200 can have a storage capacity of approximately 64 MB to approximately 4 GB. In other embodiments, however, the flash memory 210 can include a different number of flash chips and/or the memory module 200 can have a different storage capacity.

The controller 212 is operably coupled to the flash memory 210 and configured to interpret commands from components outside the memory module (e.g., the host), read data from and write data to the flash memory 210, supply addresses to the flash memory 210, and sequence data for transmission (and upon reception). The controller 212 in the illustrated embodiment, for example, includes a flash memory interface 214 coupled to the flash memory 210, a local microprocessor 216, a RAM buffer and USB endpoint controller 218, and a data buffer 220.

The connector 230 is operably coupled to the controller 212 and configured to transfer signals to/from the memory module 200. As discussed previously, the connector 230 is configured to support both the USB serial interface and the CompactFlash interface. For example, the connector 230 in the illustrated embodiment is configured to receive seven signals that travel along seven conductors physically and electrically connected to the connector 230. The signals include Vbus, D+, D−, Ground, Write Protect, Reset, and Read/Busy Status. These signals can be the same or generally similar to the signals described above with reference to FIG. 1. The D+, D−, Reset, and Write Protect signals may be passed directly to the controller 212. The controller 212 may operate on the voltage supplied on Vbus, using the Ground signal as a common ground. Vbus, however, is likely to be regulated by a power regulator or voltage regulator (not shown). Further details regarding the connector 230 and pin assignments/pin types for the connector 230 are discussed below with reference to FIGS. 3A and 3B.

The controller 212 receives commands and data along data lines D+ and D−, including requests to read, write, and/or otherwise operate. For example, the controller 212 can receive data from the memory 210 in parallel form and serialize the data for transmission along the D+ and D− lines. The controller 212 can also convert serial data received along the D+ and D− lines to parallel format data for writing to the flash memory 210. If it becomes necessary to reset the entire memory module 200, a separate reset signal may be sent along the Reset line. Similarly, if write protection is desired for data stored on the memory module 200, a write protect signal may be sent along the Write Protect line, thereby allowing the controller 212 to disable writes to the flash memory 210. The Write Protect line, for example, can be utilized to protect data stored in the flash memory 210 when the surrounding system is experiencing effects which are likely to produce transient voltages (e.g., during a power-on reset).

The USB 2.0 specification defines four types of transfers: (a) control—typically used to support configuration, command, and status communication between the host and the device; (b) interrupt—used to support small, limited-latency transfers to or from a device, such as coordinates from a pointing device or status changes from a modem; (c) isochronous—used for periodic, continuous communication between the host and the device, such as audio or video data streams; and (d) bulk—intended for non-periodic, large-packet communication with relaxed timing constraints such as between the host and a printer or scanner. The USB controller 212 in the memory module 200 is generally configured to support only the bulk and control transfer modes. The interrupt and isochronous transfer protocols are not supported. In other embodiments, however, the controller 212 may be configured to support a different transfer modes.

FIG. 3A is a diagram of a pin-out configuration a fifty pin connector in accordance with one embodiment of the invention. More specifically, FIG. 3A illustrates one embodiment of a pin-out configuration for the connector 230 as compared with a standard fifty pin CompactFlash pin-out configuration 290. In contrast with the configuration of the conventional CompactFlash pin-out 290, the connector 230 does not include assignments for each of the fifty pins. Rather, the connector 230 can function with only a fraction of the pins. For example, at its most basic level, the memory module 200 can function with the connector 230 having only four operative signals (e.g., power (Vbus), ground, D+, and D−). In one embodiment, for example, the connector 230 can include (a) power at pins 13 and 38, (b) ground at pins 1, 14, 16, 33, 39, 41, and 50, and (c) data lines D+ and D− at pins 15 and 40, respectively.

As discussed above with reference to FIG. 2B, the connector 230 can also include pin assignments for one or more supplementary control signals in addition to the four basic signals. The connector 230 illustrated in FIG. 3A, for example, includes an assignment for a reset signal (RST#) at pin 8. This feature allows a host to send a signal to the memory module 200 (FIGS. 2A and 2B) to reset the module. The connector 230 also includes an assignment for a write protect signal (WP#) at pin 10. This feature allows the host to send a signal that prevents any more data from being written to the memory module 200.

The connector 230 can further include an assignment for a card detect signal (CD#) at pin 24 and a status signal (STS) at pin 45. The card detect feature allows a socket to detect that the memory module 200 is plugged in or otherwise received within the socket. Conventional CompactFlash connector sets (such as the CompactFlash pin-out configuration 290) are typically configured with pins 25 and 26 as "card detector" pins. Pins 25 and 26 are generally shorter then the other forty eight pins of the connector set and, accordingly, are generally the last pins to mate with a corresponding socket. This feature can help ensure that the card is properly seated within the socket. The connector 230, however, includes a card detect signal assignment for pin 24 to detect when the memory module 200 is properly seated within a socket designed for use with the memory module (not a standard CompactFlash socket). The status signal at pin 45 is configured to transmit signals regarding the status of the memory module 200. For example, in several embodiments the memory module 200 and/or the host device can include an LED that lights up or blinks when the memory module 200 is active (e.g., reading or writing data).

FIG. 3B is a chart 300 illustrating the above-mentioned pin assignments and pin types for the connector of FIG. 3A. More specifically, the chart 300 includes the pin assignments and pin types for a fifty pin connector configured for operation in three different modes. For example, the chart 300 includes a first column 310 outlining the pin assignments/pin types for a CompactFlash card operating in PC Card memory mode and a second column 320 outlining the pin assignments/pin types for a CompactFlash card operating in True IDE mode. The pin assignments/pin types in these two modes are generally similar to the pin-out configuration of the connector 290 illustrated in FIG. 3A. The chart 300 further includes a third column 330 outlining the pin assignments/pin types for the connector 230, which operates in USB mode. The pin assignments in column 330, for example, correspond with the embodiment of the connector 230 illustrated in FIG. 3A.

The pin-out configuration of the connector 230 described above with reference to FIGS. 3A and 3B is one particular embodiment of a suitable pin-out configuration for the connector 230. In other embodiments, however, the connector 230 can have other pin-out configurations and/or include additional features in addition to, or in lieu of, the features described above.

Figure 4:
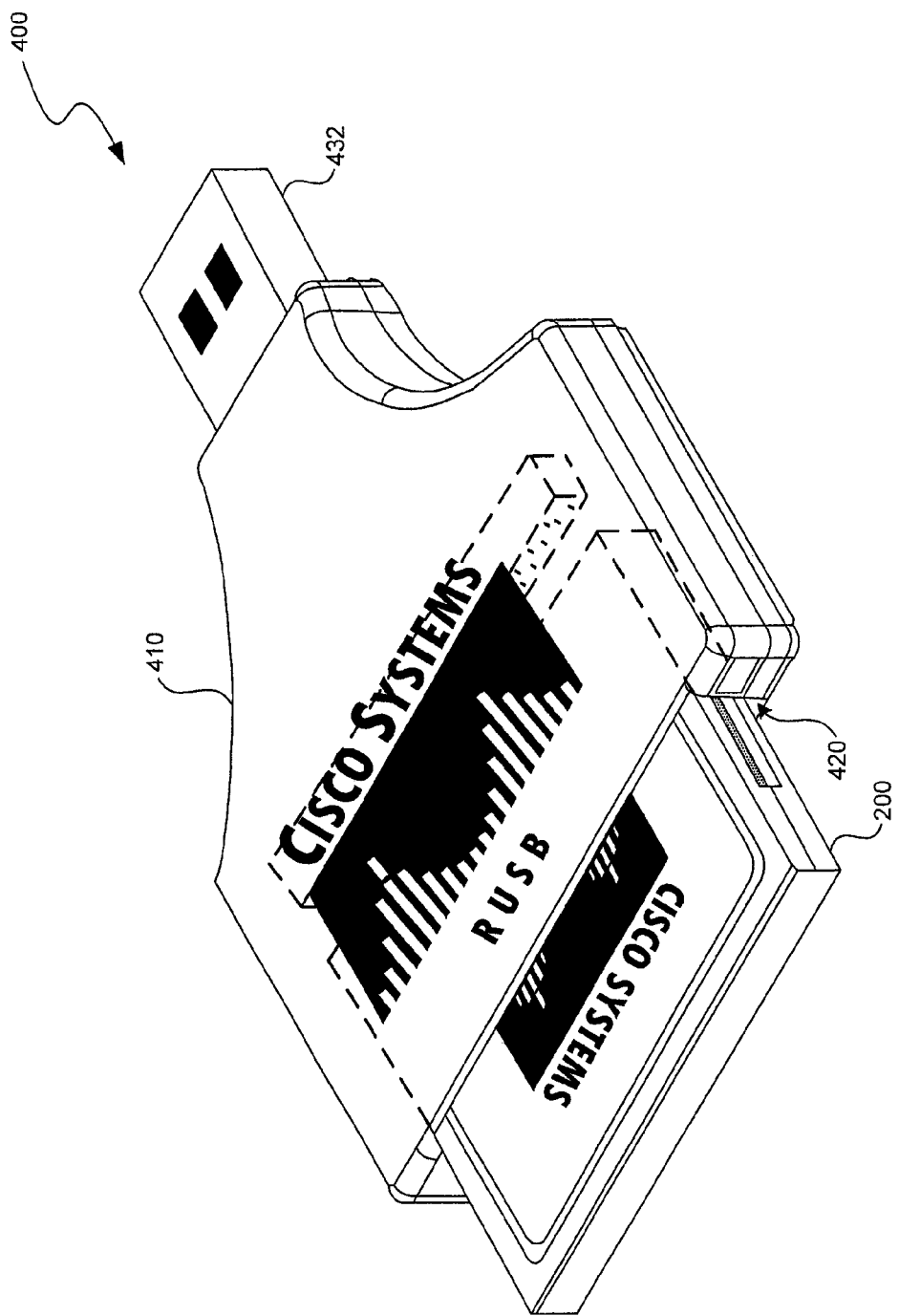
FIG. 4 is an isometric view of an adapter for use with the memory module of FIG. 2A and a standard USB type B connector set.

FIG. 4 is an isometric view of an adapter 400 for use with the memory module 200 of FIGS. 2A and 2B and a host device's standard USB type B connector set (not shown). The adapter 400 includes a housing 410 having a socket or receptacle 420 configured to receive the memory module 200. The adapter 400 also includes a first connector 430 (shown schematically in broken lines) to interface with the connector 230 of the memory module 200. The first connector 430, for example, can be designed specifically for the particular pin-out configuration of the memory module as described above with reference to FIGS. 3A and 3B. In other embodiments, however, the first connector 430 can have other arrangements.

The adapter 400 further includes a second connector 432 configured as a USB type B connector. The second connector 432 is configured to mate with a corresponding USB connector on a personal computer, laptop computer, or other suitable host device (not shown) so that the host and the memory module 200 can exchange data. For example, data can be downloaded from and/or uploaded to the memory module 200. The adapter 400 can accordingly eliminate the need and added expense of external card readers or devices. In other embodiments, the adapter 400 can have a different configuration and/or include different features.

From the foregoing, it will be appreciated that specific embodiments of the invention have been described herein for purposes of illustration, but that various modifications may be made without deviating from the spirit and scope of the invention. For example, the memory module 200 can have a different configuration and/or include different features than those described above. Aspects of the invention described in the context of particular embodiments may be combined or eliminated in other embodiments. For example, a memory module including a two-wire serial data bus and the USB-IF communication protocol could have a form factor corresponding to a number of different industry standard storage/memory devices (e.g., Express Card, PC Card, etc.), and could include many of the advantages of the memory modules described above (e.g., improved mechanical, electrical, and reliability attributes as compared with conventional memory devices). Further, while advantages associated with certain embodiments of the invention have been described in the context of these embodiments, other embodiments may also exhibit such advantages, and not all embodiments need necessarily exhibit such advantages to fall within the scope of the invention. Accordingly, the invention is not limited except as by the appended claims.

We claim:

1. A portable memory device, comprising:
   a casing having a form factor;
   a flash-based hard drive in the casing;
   a serial data bus in the casing and coupled to the hard drive, wherein the serial data bus is configured to read data from and write data to the hard drive; and
   a connector coupled to the serial data bus and having a plurality of pins configured to transfer signals to and from the memory device, and wherein the pins are configured to interface with a fifty pin socket of a host device,
   wherein the fifty pin socket includes pin locations 1 through 50 arranged in a pattern corresponding to a standard socket configuration; and
   the connector includes two power lines, seven ground lines, a first data line, a second data line, a reset line, a write protect line, a card detect line, and a status line, and wherein the connector does not include pins corresponding to the remaining pin locations of the fifty pin socket.

2. The memory device of claim 1 wherein the serial data bus is configured to transfer signals using a bulk transfer mode and/or a control transfer mode.

3. The memory device of claim 1 wherein the connector has less than fifty pins.

4. The memory device of claim 1 wherein the casing has a length of 36 mm, a width of 43 mm, and a thickness of 3.3 mm.

5. A method of manufacturing a portable memory module, the method comprising:
   providing a housing having a form factor and an external connector including a plurality of pins configured to transfer signals to and from the portable memory module;
   installing one or more flash memory devices in the housing; and
   installing a serial data bus in the housing and coupling the serial data bus to the one or more flash memory devices and the external connector,
   wherein providing the housing having the external connector includes providing the external connector configured to mate with a fifty pin socket on an external host device, and wherein the external connector includes less than twenty pins.

6. The method of claim 5 wherein providing a housing having a external connector includes providing a connector configured to mate with a fifty pin socket on an external host device.

* * * * *